(12) United States Patent
Bohn et al.

(10) Patent No.: US 10,408,885 B2
(45) Date of Patent: Sep. 10, 2019

(54) TRANSPORTABLE WARMING CART

(71) Applicant: Carter-Hoffmann LLC, Mundelein, IL (US)

(72) Inventors: Robert Cooper Bohn, Arlington Heights, IL (US); Richard Joseph Paddock, Jr., Antioch, IL (US); Jeffrey S. Erber, Edwardsville, IL (US); Robert C. Fortmann, Grayslake, IL (US)

(73) Assignee: Carter-Hoffmann LLC, Mundelein, IL (US)

( * ) Notice: Subject to any disclaimer, the term of this patent is extended or adjusted under 35 U.S.C. 154(b) by 200 days.

(21) Appl. No.: 15/594,997

(22) Filed: May 15, 2017

(65) Prior Publication Data
US 2017/0328958 A1 Nov. 16, 2017

Related U.S. Application Data

(60) Provisional application No. 62/454,271, filed on Feb. 3, 2017, provisional application No. 62/336,160, filed on May 13, 2016.

(51) Int. Cl.
| | |
|---|---|
| *A47J 39/02* | (2006.01) |
| *G01R 31/371* | (2019.01) |
| *F24C 7/08* | (2006.01) |
| *H05B 1/02* | (2006.01) |
| *A47J 39/00* | (2006.01) |
| *G08B 5/36* | (2006.01) |

(Continued)

(52) U.S. Cl.
CPC .......... *G01R 31/371* (2019.01); *A47J 39/003* (2013.01); *A47J 39/006* (2013.01); *A47J 39/02* (2013.01); *F24C 7/087* (2013.01); *G08B 5/36* (2013.01); *H05B 1/0236* (2013.01); *H05B 1/0252* (2013.01); *G01R 31/386* (2019.01); *G01R 31/3835* (2019.01); *H05B 2203/028* (2013.01); *H05B 2203/035* (2013.01)

(58) Field of Classification Search
CPC ....... A47J 39/006; A47J 39/02; H05B 1/0236; H05B 1/0252; H05B 2203/028; H05B 2203/035; F24C 7/087
USPC .......... 165/263; 219/387, 413, 486, 490, 494
See application file for complete search history.

(56) References Cited

U.S. PATENT DOCUMENTS

| | | | | |
|---|---|---|---|---|
| 3,965,969 A | * | 6/1976 | Williamson | .......... A47J 39/006 165/267 |
| 4,019,022 A | | 4/1977 | Seider et al. | |

(Continued)

OTHER PUBLICATIONS

International Preliminary Report on Patentability and Search Report for PCT/US2017/032322, dated Nov. 13, 2018, 7 pp.

(Continued)

*Primary Examiner* — Matthew W Jellett
(74) *Attorney, Agent, or Firm* — Brinks Gilson & Lione

(57) ABSTRACT

A method of displaying a battery life for a warming cart battery is provided. The method includes the steps of detecting with a processor that a warming cart battery voltage is out of range of a predetermined threshold, determining with a processor an operation state of each of a plurality of periphery warming cart devices, and automatically setting a battery scale of a warming cart battery based on which of the plurality of periphery warming cart devices are in an active operation state.

7 Claims, 10 Drawing Sheets

(51) Int. Cl.
 *G01R 31/385* (2019.01)
 *G01R 31/3835* (2019.01)

(56) References Cited

U.S. PATENT DOCUMENTS

| | | | | |
|---|---|---|---|---|
| 5,454,427 | A | * | 10/1995 | Westbrooks, Jr. ...... A23L 3/365 |
| | | | | 165/267 |
| 5,655,595 | A | * | 8/1997 | Westbrooks, Jr. .... A47J 39/006 |
| | | | | 165/48.1 |
| 5,771,959 | A | * | 6/1998 | Westbrooks, Jr. ...... A23L 3/365 |
| | | | | 165/11.1 |
| 5,784,295 | A | | 7/1998 | Hinohara |
| 5,797,445 | A | * | 8/1998 | Westbrooks, Jr. ...... F25D 23/12 |
| | | | | 165/11.1 |
| 6,433,512 | B1 | | 8/2002 | Birkler et al. |
| 10,258,197 | B1 | * | 4/2019 | Fortmann ............. A47J 39/006 |
| 2009/0027056 | A1 | | 1/2009 | Huang et al. |
| 2012/0246350 | A1 | | 9/2012 | Lee |
| 2013/0257382 | A1 | | 10/2013 | Field et al. |
| 2015/0135528 | A1 | | 5/2015 | Buchmann et al. |
| 2017/0131017 | A1 | * | 5/2017 | Heinrich ................. F25D 19/02 |

OTHER PUBLICATIONS

International Search Report for PCT/US2017/032322, dated Sep. 15, 2017, 4 pp.
Written Opinion of the International Searching Authority for PCT/US2017/032322, dated Sep. 15, 2017, 6 pp.

\* cited by examiner

TRANSPORTABLE WARMING CART

CROSS-REFERENCE TO RELATED APPLICATIONS

This application claims priority from U.S. Provisional Application No. 62/336,160 filed on May 13, 2016, and from U.S. Provisional Application No. 62/454,271 filed on Feb. 3, 2017, the entirety of each are hereby fully incorporated by reference herein.

TECHNICAL FIELD

The subject disclosure is directed to transportable containers or carts that are configured to keep food product disposed therein warm for an extended period of time when not plugged in to a source of electrical power.

BRIEF SUMMARY

A first representative embodiment of the disclosure is provided. The embodiment includes a method of displaying a battery life for a warming cart battery. The method includes the steps determining with a processor an operation state of each of a plurality of periphery warming cart devices, and automatically setting a battery scale of a warming cart battery selected from a plurality of battery scales based on which of the plurality of periphery warming cart devices are in an active operation state, wherein each of the plurality of battery scales represent a different range of voltages between a charge value for the warming cart battery and a predetermined state of discharge of the warming cart battery over a period of time based on the active operation state of the plurality of periphery warming cart devices. The method further includes the steps of measuring a warming cart battery voltage, and automatically displaying a remaining life of the warming cart battery based on the measured warming cart battery voltage in relation to the set battery scale.

Another representative embodiment of the disclosure is provided. The embodiment includes a battery life display circuit. The battery life display circuit includes a warming cart battery, and a plurality of periphery warming cart devices configured to draw power from the warming cart battery. A processor is configured to automatically set a battery scale used to measure a remaining life of the warming cart battery based on an operational status of each of the plurality of periphery warming cart devices. A display is operatively coupled to the processor for displaying a remaining life of the warming cart battery as a percentage of a voltage across the warming cart battery as measured by the processor and the automatically set battery scale.

Yet another representative embodiment of the disclosure is provided. The embodiment includes a food holding cabinet. The cabinet includes a housing with a food storage compartment and a battery compartment. The battery compartment is configured to receive a battery and an electrical connection configured to allow for the flow of electrical current from the battery to a plurality of electrical heaters disposed in thermal communication with the food storage compartment. The battery compartment comprises a shelf that is slidably mounted with in the battery compartment, the shelf being slidable between a stowed position where the battery is disposed within the housing, and an extended position wherein at least a portion of the battery extends outside of the housing.

Advantages of the disclosed devices will become more apparent to those skilled in the art from the following description of embodiments that have been shown and described by way of illustration. As will be realized, other and different embodiments are contemplated, and the disclosed details are capable of modification in various respects. Accordingly, the drawings and description are to be regarded as illustrative in nature and not as restrictive.

BRIEF DESCRIPTION OF THE PREFERRED EMBODIMENTS

Figure 1:
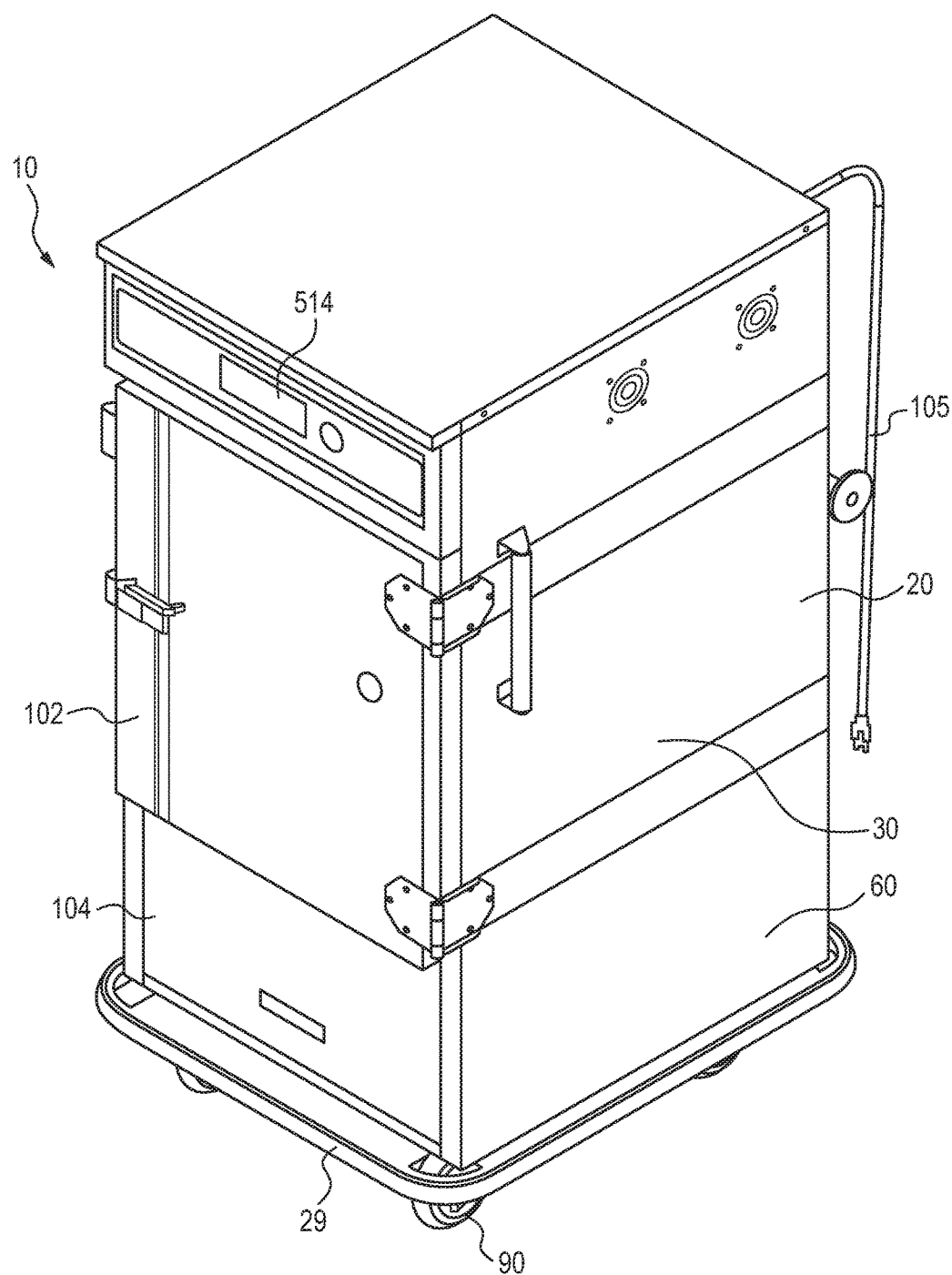
FIG. 1 is a perspective view of a portable warming cart.

Turning now to FIGS. 1-4A a warming cart 10 is provided. The warming cart 10 may be a portable cart that is easily movable within a facility, and may move on a plurality of castors 90 that extend from a base 29 of the housing 20 of the device. The warming cart 10 may include a food storage compartment 30 that is disposed within the housing and a battery compartment 60 that is also disposed within the housing 20.

Figure 1A:
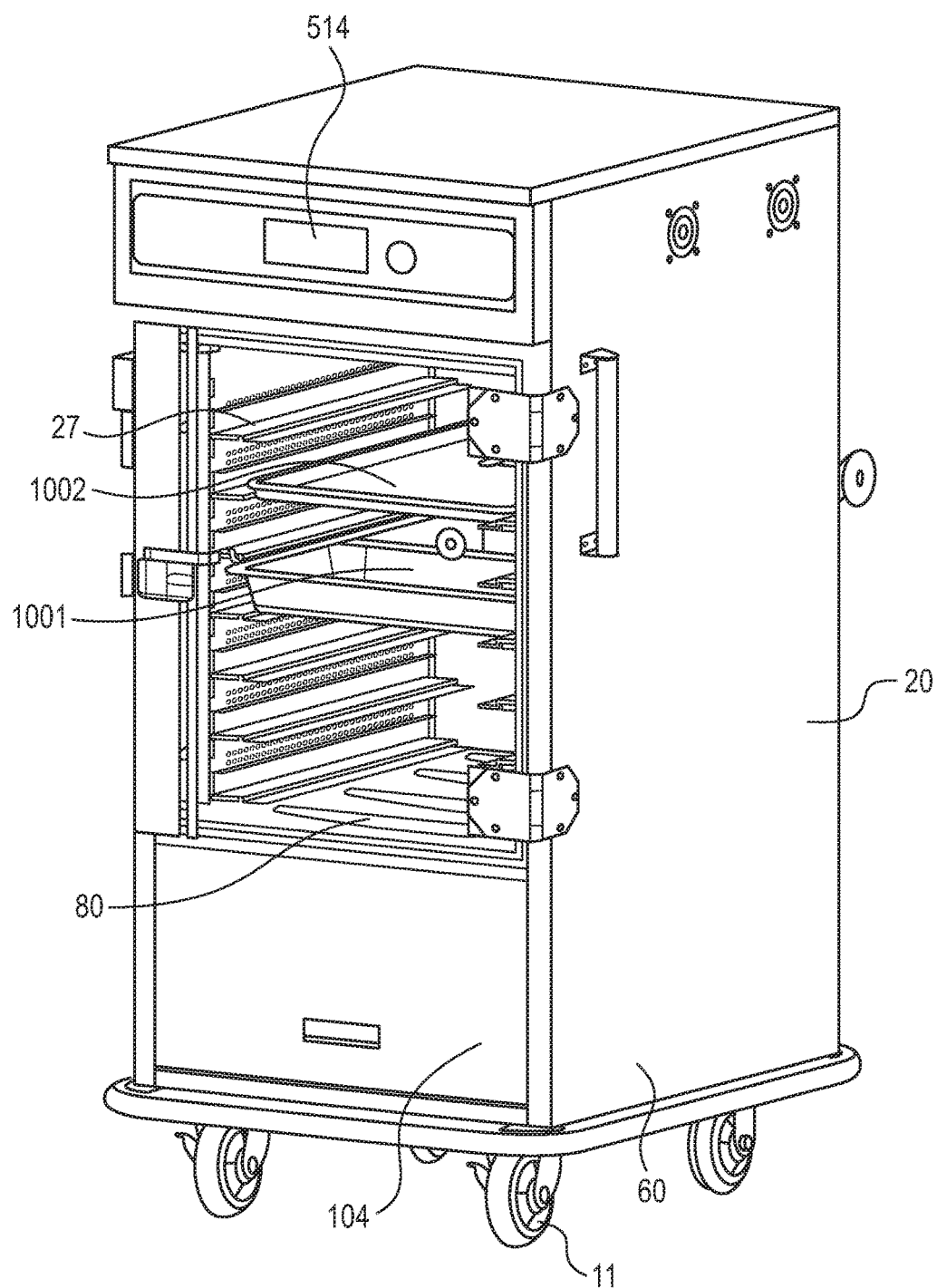
FIG. 1A is a perspective view of the warming cart of FIG. 1, with the food compartment door removed.
Figure 1B:
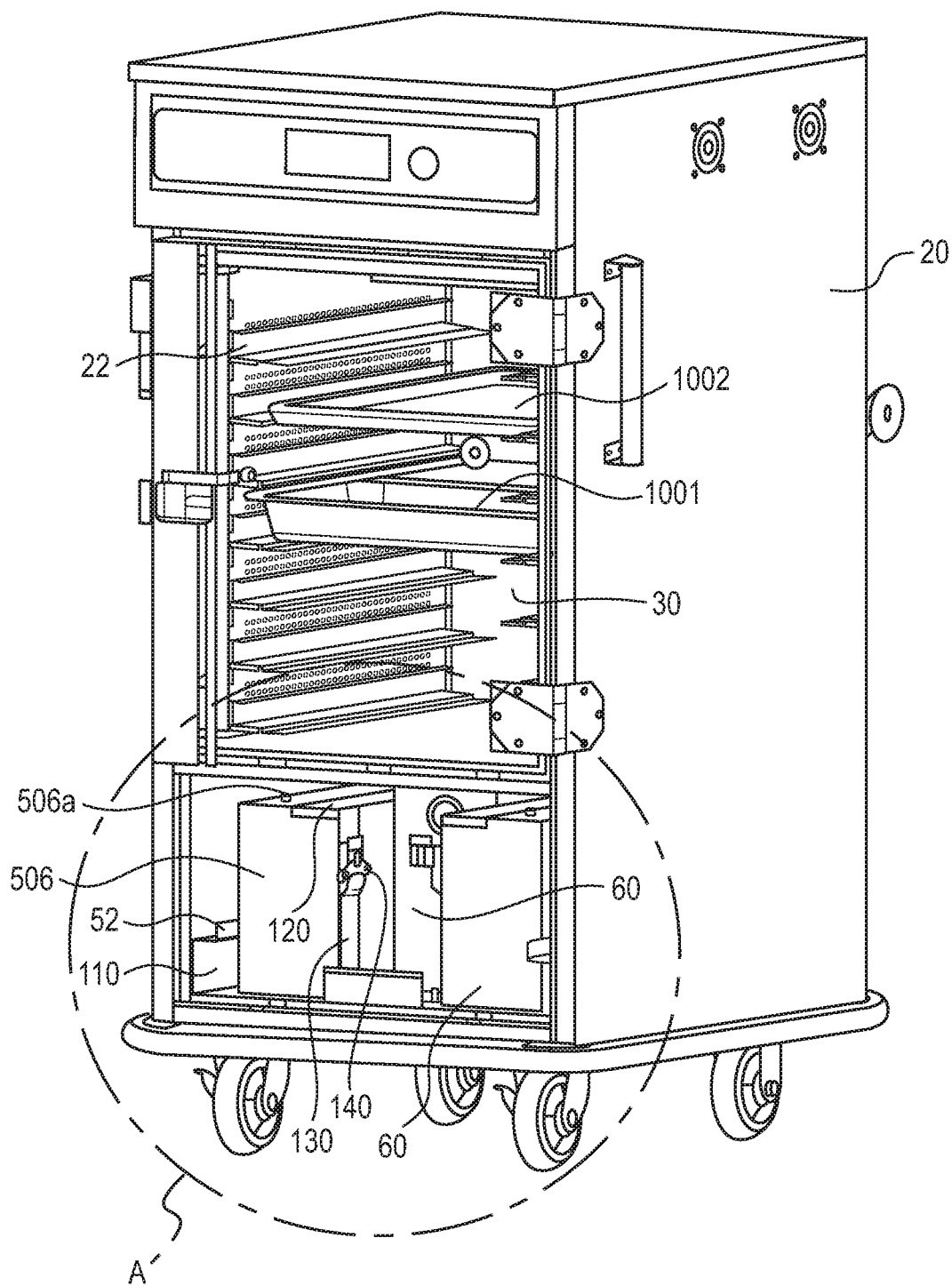
FIG. 1B is a perspective view of the warming cart of FIG. 1A, with the battery compartment door removed.
Figure 2:
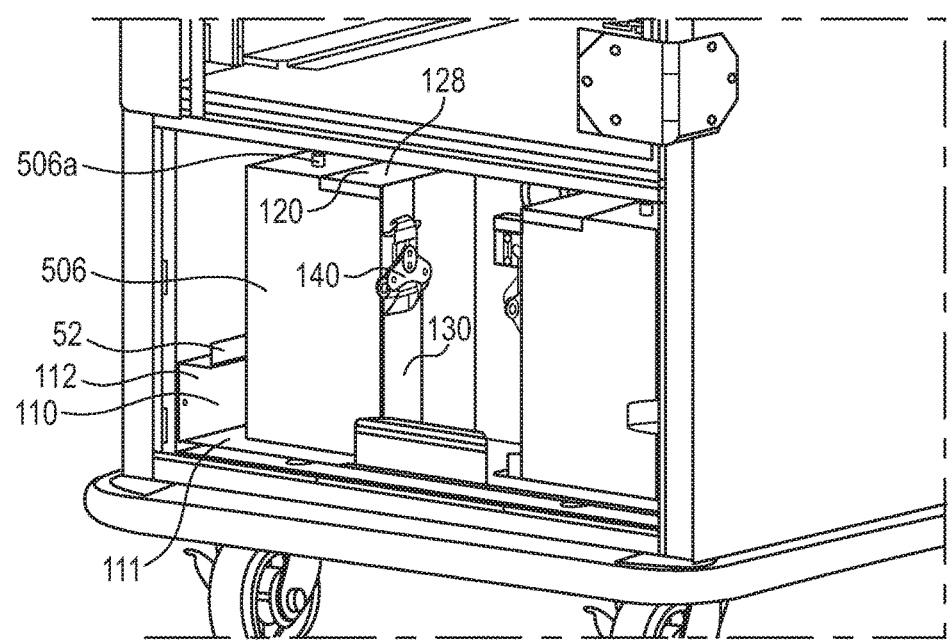
FIG. 2 is a view of detail A of FIG. 1B.
Figure 3:
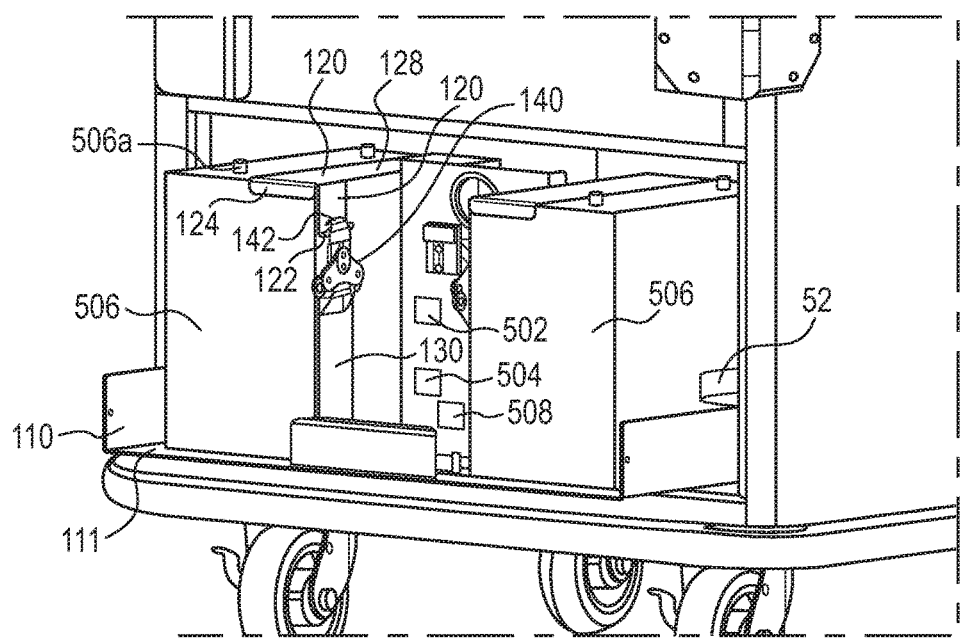
FIG. 3 is the view of FIG. 2, with the battery assembly slid partially outside of the battery compartment.
Figure 4:
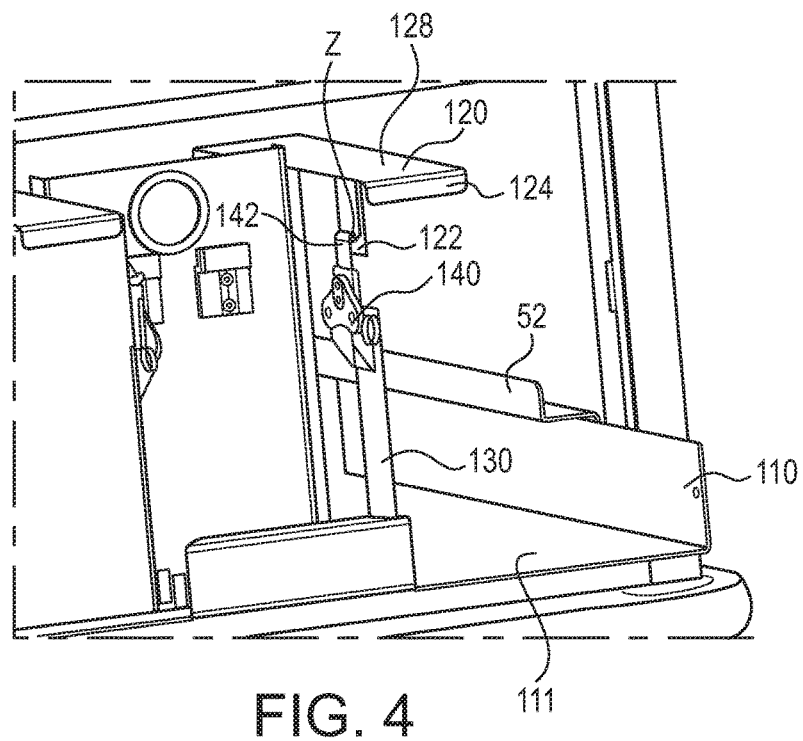
FIG. 4 is another perspective view of the battery compartment of the warming cart of FIG. 1, with the battery removed.
Figure 4A:
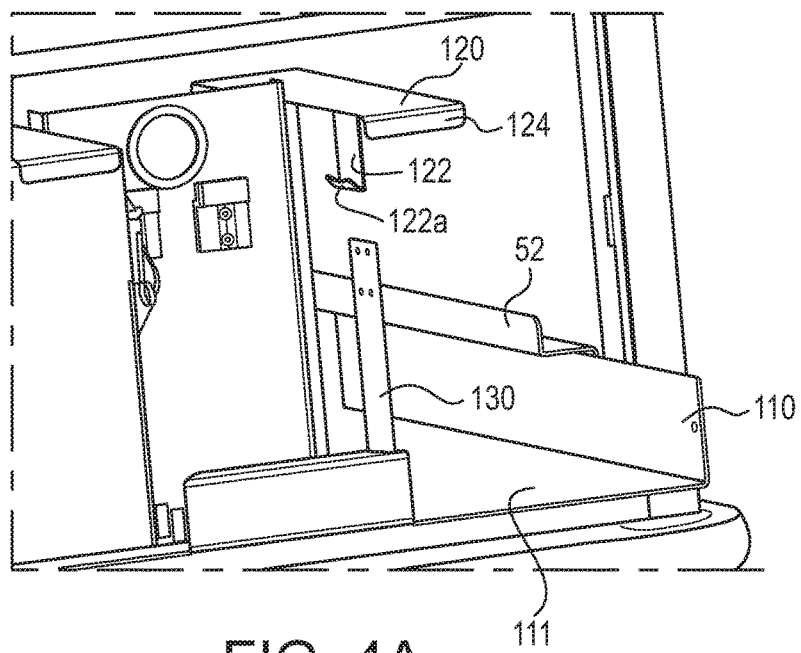
FIG. 4A is the view of FIG. 4 with the lock removed.

The food storage compartment 30 may be a space that is selectively isolated by one or more pivotable doors 102, which is configured to receive and support a plurality of trays 1001 and/or pans 1002 therein. The food storage compartment 30 receives heat to maintain a heated environment such that the food placed therein (such as within pans or upon sheets, or the like) remains heated while disposed therein and while the warming cart is moved through a facility or transported via a vehicle. The food storage compartment 30 may include a plurality of electric heating elements disposed therein (shown schematically in FIG. 1A as 80), or may receive heat from electric heating elements that are remote from the compartment, with the heat generated by the heating elements transported to the food warming compartment 30. As discussed in additional detail below, the electric heating elements may be powered either from a conventional source of electrical power via a cord 105 that can be connected with a conventional electrical outlet, or the electric heating elements may be powered from one or more batteries 506 that are disposed within the battery compartment 60. When the electric heating elements 80 are powered from the battery 506, the warming cart 10 may be moved to a location without electrical power service (such as transported through a facility, or transported from the facility to a remote location). The description below provides detail of the system for either charging the battery or allowing the battery to provide power to the electrical heating elements as well as other electrical components of the warming cart.

The battery compartment 60 is provided within the housing 20 and may be provided at the bottom of the housing 20 and below the food storage compartment 30, or at another convenient position within the housing 20, to allow the battery compartment 60 to be accessed as needed (such as to change out batteries within the compartment as discussed below) and to allow the food storage compartment 30 to be positioned at a location within the housing 20 to allow for easy and ergonomic access to the food storage compartment 30. The battery compartment 60 may be enclosed by one or more doors 104 that can be opened to allow a user access to internal volume of the battery compartment 60. The battery compartment doors may be latched and in some embodiments locked into the closed position.

The battery compartment 60 may include a shelf 110 upon which one, two, or more batteries 506 are disposed during operation of the cart. The shelf 110 may be disposed in conjunction with the battery compartment to be slidable from a normal stowed position (FIG. 2), where the batteries 506 and associated components are disposed within the volume of the housing 20 to allow the door 104 to be closed. When the door 104 is opened, the shelf 110 may be slidable with respect to the side walls of the battery compartment 60 to an extended position to allow a portion of the shelf 110 to extend outside of the housing 20 (FIG. 3) to allow the user to easily access and manipulate the battery 506 and components and structures (discussed in detail below) to stow and lock the battery 506 into place. In some embodiments, the shelf 110 may include surfaces that slide upon opposing portions of the housing 20 to allow the shelf 110 to slide with respect to the housing 20. The sliding surfaces (either on the shelf 110, the housing 20, or both) may be coated with a low friction material to minimize the force that needs to be applied to slide the shelf 110 into or out of the housing 20. In other embodiments, the shelf 110 or the housing 20 may include rollers that engage the other of the shelf 110 or the housing 20 to allow the shelf to be moved with respect to the housing 20 via the rollers.

The shelf 110 may support a roof 120 that is aligned to rest over or upon at least a portion of an outer surface of the battery 506 when the battery is installed upon the shelf 110. The roof 120 may rest upon the top surface of the battery 506, or in other embodiments, the roof may rest upon a side surface of the battery 506, or in some embodiments, the roof 120 may rest upon both a portion of the top surface and a portion of a side surface of the battery 506 (portion 124), such as with the roof 120 depicted in FIGS. 2 and 3. The roof 120 is fixed to the shelf 110, such that the roof 120 (and components connectable to the roof 120 to allow the roof 120 to selectively tightly engage the battery, discussed below) is configured to slide along with the shelf 110 with respect to the housing 20. In some embodiments, a portion of the roof 120 is fixed to the shelf in a cantilevered fashion, with an extended portion 128 that engages the battery 506 when properly positioned. The roof 120 may be configured to be flexible such that the extended portion 128 may be curved or slightly bent when the lock 140, discussed below, is engaged. In some embodiments, the roof 120 may be a thin sheet of stainless steel.

The roof 120 may be disposed such that when in a released position, the roof 120 is aligned to allow a battery 506 to be slid into its normal position upon the shelf 110 and also withdrawn from the shelf 110, and the roof 120 is configured to tightly engage the battery 506 when the lock 140 is engaged such that the roof 120 prevents the battery 506 from moving with respect to the shelf 110. In some embodiments, the roof 120 is connected to the shelf 110 and selectively tightened with respect to the battery 506 and released with respect to the battery 506 without any tools.

The roof 120 may include an arm 122 that extends therefrom and can be engaged by the lock 140. In some embodiments where the roof 120 engages a top surface of the battery 506, the arm 122 extends downwardly from the top surface of the roof 120, toward the bottom surface 111 of the shelf 110. In other embodiments where the roof 120 engages a side surface of the battery 506, the arm 122 may extend vertically or in a different side direction than the roof 120. The arm 122 may include a curved end 122a that engages the lock 140, and when the lock 140 is in an actuated position, the lock pulls upon the curved end 122a, which pulls on the arm 122, which pulls upon the roof 120, in a direction to urge the roof to contact and tightly engage the battery 506. The arm 122 may extend from the extended portion 128 of the roof 120, such that when the arm 122 is pulled by the lock 140 (as discussed below), the extended portion 128 of the roof is pulled in the same direction (toward surface to surface engagement with the battery 506 to tightly engage the neighboring surface of the battery 506).

The lock 140 is fixed with respect to the shelf 110, either directly connected to the shelf 110 (such as with one or more fasteners, with a weld joint, or via another method) or is fixed with respect to the shelf 110 with a bar 130 therebetween. The lock 140 includes a curved end 142 that engages the curved end 122a of the arm 122 to selectively pull the arm 122 (and therefore the roof 120) downwardly toward the lock 140 when the lock is engaged. The lock 140 includes an operator 144 that is operable with a user's fingers and can be rotated to pull or release the curved end 142 (i.e. either the engaged or released positions, respectively). In some embodiments, the lock 140 may be an over center mechanism where the lock is urged to the release position (FIG. 4, with a gap Z disposed between the opposed curved ends 122a, 142) when the operator 144 is urged past an intermediate point toward the release position, and where the lock is urged to the engaged position when the operator 144 is urged based the intermediate point toward the lock position. In some embodiments, the lock 140 may include a spring that urges the lock into the engaged position and, where the lock 140 is an over center mechanism, the spring also urges the lock into the release position. In some embodiments, the lock may be a non-locking spring loaded draw latch. While the term "lock" is used to describe various possibilities of the structure of element 140 for the sake of brevity, the lock 140 may be a latch, wherein the lock 140 is retained at either the engaged position or the release position, with the user being able to freely manipulate the operator to change the position of the lock.

In some embodiments, the housing 20 may include an alignment portion 52 that in conjunction with the roof 120 and the lock 140 and bar 130 (when the lock 140 is in the engaged position) aligns the battery 506 upon the shelf 110 and prevents the battery 506 from moving or becoming misaligned.

The battery 506 includes terminals 506a (such as positive and negative terminals) that are, when the battery 506 is positioned upon the shelf 110 and with respect to the roof 120, and in preferred embodiments when the shelf 110 is in the extended position, easily accessible to the user such that the user can connect and or disconnect the electrical cables to the terminals 506a to allow for the battery 506 to be selectively connected or disconnected from the electrical system of the warming cart 10. The electrical connectors for the battery terminals are not shown in FIGS. 1-4B but are conventional and are well understood in the art.

Figure 7:
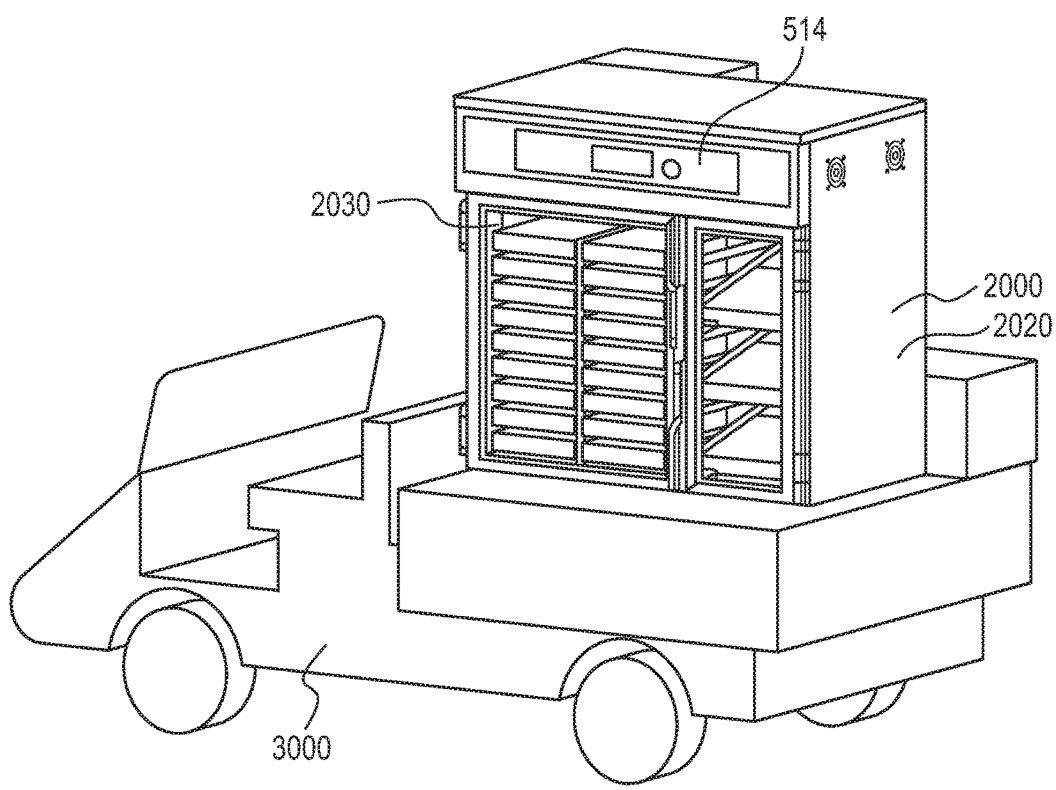
FIG. 7 is a perspective view of a warming cabinet that is disposed upon a vehicle.

Turning now to FIG. 7, a transportable food warming container 2000 may be provided. The container 2000 includes a housing 2020 and a food storage portion 2030. The container 2000 may be provided upon a movable vehicle 3000, such as a golf cart, such that the container 2000 can maintain foods disposed therein in a warm condition when the container, and the vehicle are traveling remotely. The food storage portion 2030 may be disposed to retain trays or pans of food products therein, and/or may retain individual servings of food products, such as food products that are already plated or packaged for a customer to receive. For example, the food storage portion 2030 could receive individual boxed pizzas that are ready to provide to a customer.

In some embodiments, the container 2000 receives electrical power (to power heaters, fans, lights, and a control system and the like) from a remote battery, which may be the battery that powers the vehicle or in other embodiments, a dedicated battery for the container 2000. In embodiments, where the battery is a dedicated battery for the container 2000, the battery may be disposed within a battery compartment, with the battery being accessible for maintenance or replacement with a mechanism similar to that discussed in FIGS. 1-4B. In some embodiments, the container 2000 may support the battery or batteries therein, such as in a battery compartment (not shown in FIG. 7, but similar to the battery compartment 60 discussed above).

Figure 5:
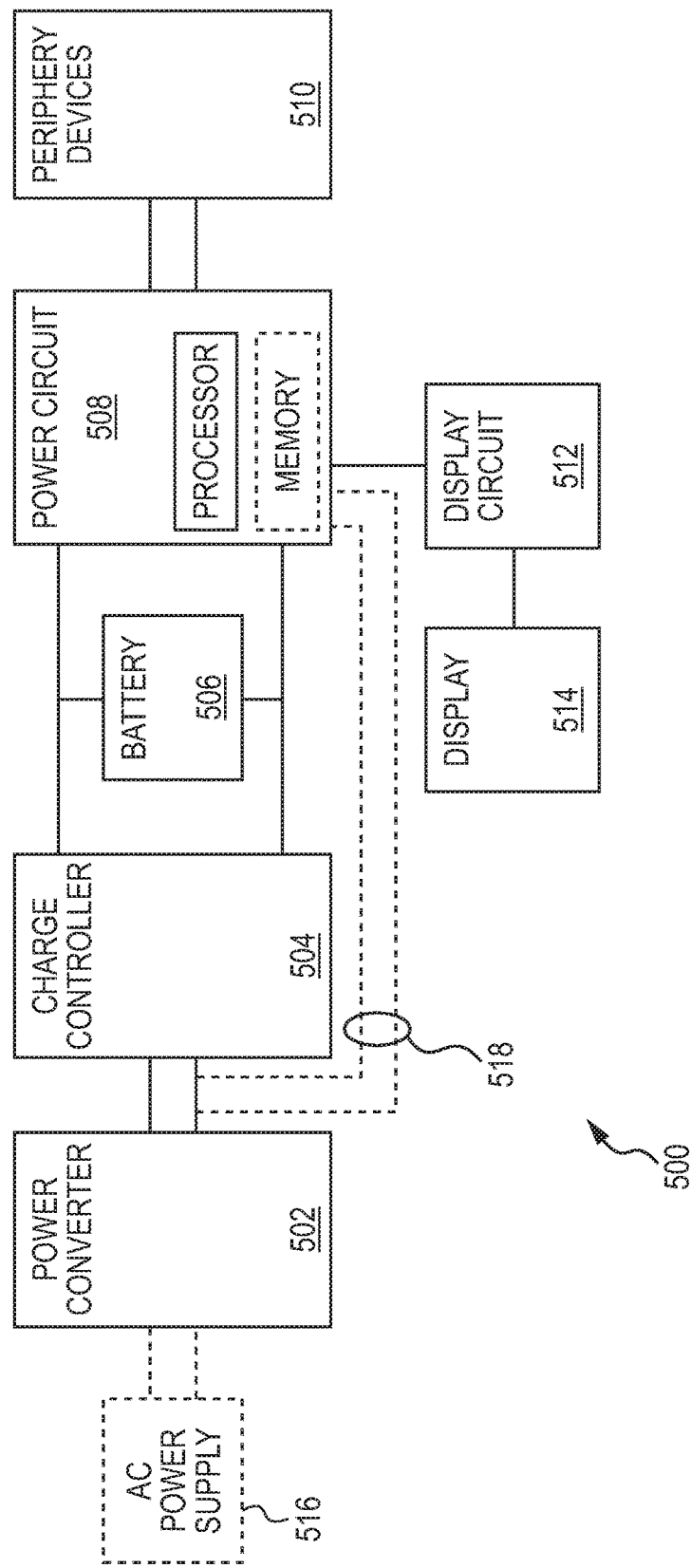
FIG. 5 shows an exemplary block diagram of a battery life display circuit 500.
Figure 6:
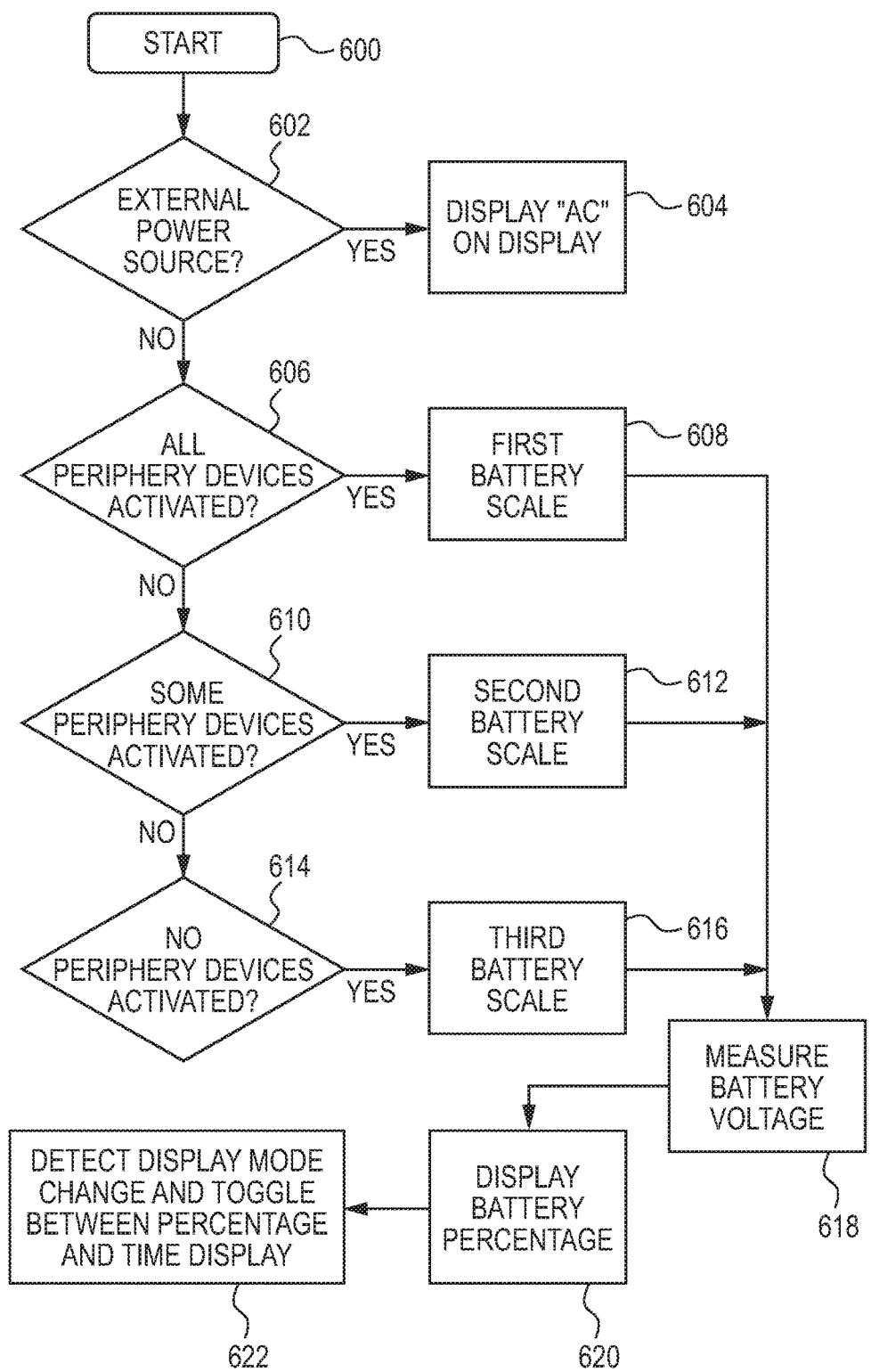
FIG. 6 is a flow diagram for displaying a battery life.
Figure 6A:
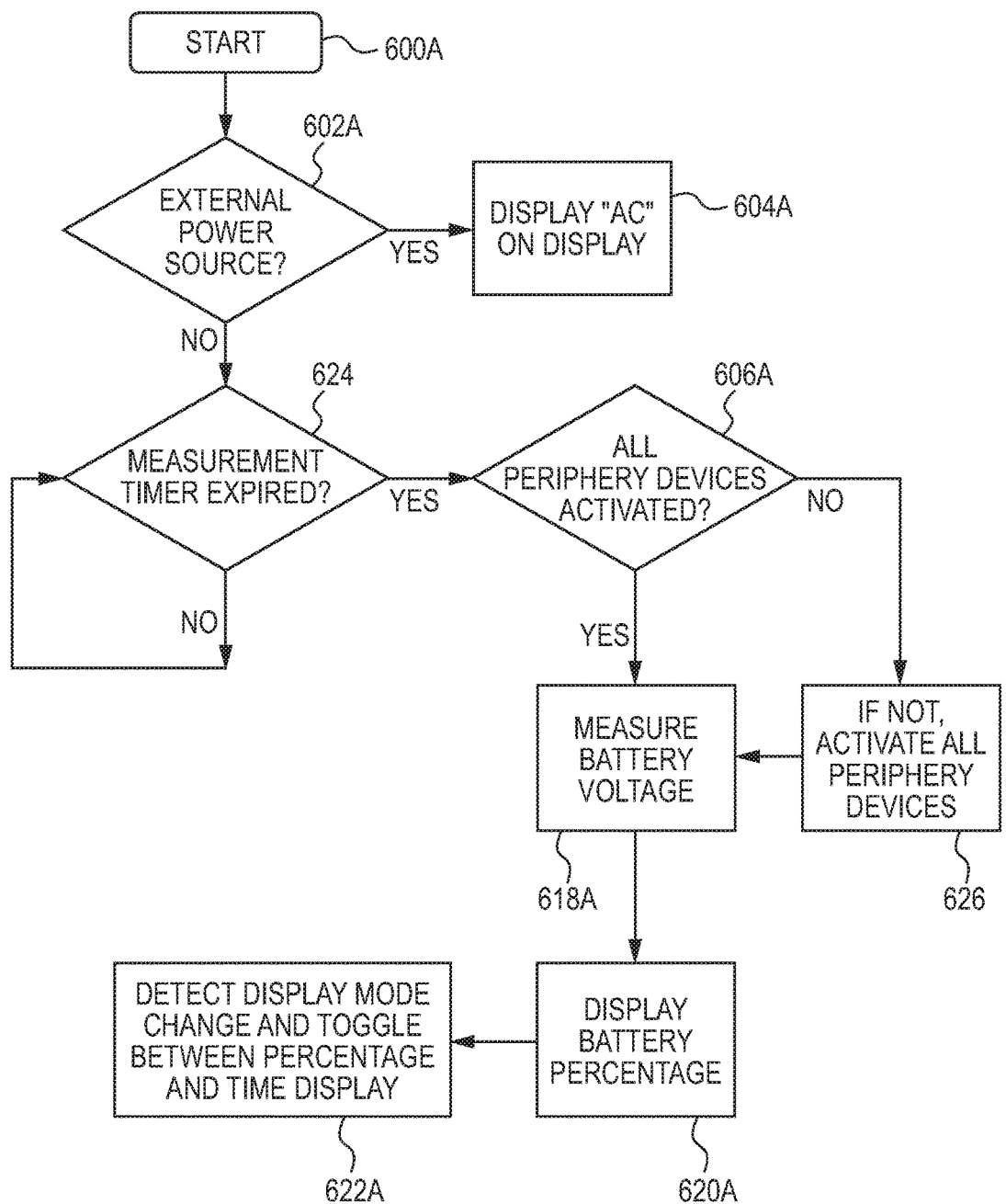
FIG. 6A is a second flow diagram for displaying a battery life.

Turning now to FIGS. 5, 6 and 6A, a battery life circuit 500 is provided to allow various parameters of the operation of the one or more batteries associated with the portable carts disclosed above. FIG. 5 shows an exemplary block diagram of a battery life display circuit 500 that may be used in conjunction with a warming cart, such as the warming cart 10 depicted in FIGS. 1-4A above, or in other types of transportable warming devices, such as a transportable food warming container 2000 that may be mounted on a vehicle, as discussed above. As will be described in more detail below, the battery life display circuit 500 is capable of varying the scale used to determine the remaining battery life based on the operational status of one or more periphery devices connected to the warming cart.

The battery life display circuit 500 may include a power converter 502, a charge controller 504, battery 506 (it is contemplated that battery 506 may comprise one or more batteries), a power circuit 508, one or more periphery devices 510, such as, but not limited to, heating elements, blower motors, and/or fans, a display circuit 512, and one or more displays 514. A power source 516 may be connected to the power converter 502, and may provide alternating current to the power converter 502. In some embodiments, one, some, or all of the power converter 502, charge controller 504 and the power circuit 508 may be located within the battery compartment 60 of the housing 20 (shown schematically in FIG. 3), while in other embodiments, one, some, or all of these components may be disposed elsewhere within the housing 20.

The power supply converter 502 is responsible for converting alternating current received from the power source 516 to direct current. In some applications the power supply converter 502 may be designed to receive as an input alternating current that is between approximately 90.0 volts and approximately 264.0 volts. In some applications, this input alternating current may have a current between approximately 6.0 amps and approximately 12.0 amps. This alternating current input may be sourced, for example, from a wall outlet. The power supply converter 502 may convert this input alternating current into a direct current that is output by the power supply converter 502 at between approximately 24.0 volts and approximately 30.0 volts and between approximately zero and approximately 37.0 amps. In some configurations, an output of the power converter 502 may be operatively coupled (518), for example through a wire, cable, or other connection, to an input of the power circuit 508. When the power converter 502 is not receiving power from the power source 516, no voltage will flow through this connection (518) to the power circuit 508, and the power circuit 508 can determine that the periphery device(s) will be powered by the battery 506. Alternatively, when a voltage flows through the connection (518) between the power converter 502 and the power circuit 508, the power circuit 508 can determine that battery life display circuit 512 is in part running off of power supplied by the power source 516.

The charge controller 504 is generally responsible for charging the battery 506. The input of the charge controller 504 is operatively coupled to the output of the power converter 502. The output of the charge controller 504 is operatively coupled to the battery 506 and to the power circuit 508. When more than one battery 506 is present in the battery life display circuit 500, the multiple batteries may be connected in series across the charge controller 504 or may include multiple strings of batteries that are connected in parallel with one another in which the batteries in a given string are connected in series with each other. Upon detecting an input voltage from the power converter 502, the charge controller 504 delivers current to its load (e.g., the battery 506 and the power circuit 508). The charge controller 504 may vary the current supplied to its load based on the voltage detected across its output terminals, which may in turn vary based on the charge state of the battery 506 and the amount of power drawn by the power circuit 508 to power any of its components and/or coupled devices, such as, for example, the periphery devices 510, display circuit 512, display(s) 514, exhaust fans, and/or other devices. Any excess power received by the power circuit 508 may be dissipated by the power circuit 508. In some applications an exhaust fan may also be coupled to the power circuit 508 to aid in dissipating the excess power and cooling the components comprising the power circuit 508, the display circuit 512, and the display(s) 514.

A portion of the current supplied by the charge controller 504 may be received by the battery 506 to recharge or maintain its charging value. In some configurations, the battery's target charging value may be approximately 26.0 volts. However, the target charging value of a battery 506 in other configurations could be higher or lower than this value.

The power circuit 508 may be embodied in hardware or software as a microprocessor, a digital microcontroller, one or more digital integrated circuits such as an application specific integrated circuit (ASICs) and/or an analog circuit, and may be capable of powering one or more periphery devices 510 and/or one or more display devices 514. The one or more periphery device 510 may terminate at the power circuit 508, and a processor within the power circuit 508 may determine the operational state of each of the periphery devices 510. In some applications, the power circuit 508 may be equipped with relays that are monitored by the processor to determine the operational state of the one or more periphery devices 510. The processor may include a memory retaining different battery life scales, as described in more detail below. The processor memory may also retrain historical measurements relating to the charging state of the battery 506. These historical measurements may include data describing a maximum or minimum charging value of the battery, the voltage of the battery 506 over time, the length of time to recharge the battery 506 to a maximum or particular charging value that is less than the maximum charging value, or the length of time for the battery 506 to discharge to a predetermined charging value. In other applications, the power circuit 508 may include a memory external from the processor that could be used to retain the battery life scales or the historical measurements relating to the charging state of the battery 506. These retrained historical battery measurements may be used by the processor to dynamically adjust the battery life scales. For example, the processor may constantly monitor the maximum charging value of the battery 506 over time. As the battery 506 ages, the maximum charging value of the battery may decrease from its original maximum charging value as a result of the load to which it is subjected. Upon detecting that the maximum charging value of the battery 506 has decreased by a predetermined percentage, the processor may automatically update one or more of the battery life scales in order to provide an end user with accurate information about the remaining life of the battery 506. The processor may also constantly monitor the length of time for the battery 506 to discharge to a predetermined level. In some applications, this discharge level could be such that the battery 506 retains approximately 65.0% or 75.0% of its charge. As the battery 506 ages, the length of time to reach this predetermined level can decrease (that is, this level could be reached sooner than when the battery is new), and upon detecting that the length of time has decreased by a predetermined percentage, the processor can automatically update the battery life scales in order to provide an end user with accurate information about the remaining life of the battery 506.

The one or more displays 514 may be coupled to the power circuit 508 through a display circuit 512. The display circuit 512 may be coupled to the power circuit 508 through a serial cable, and is capable of communicating information to a user through the display(s) 514 and receiving instructions from the user. In some embodiments, the display interface 512 may include one or more battery life mode buttons that can be used to switch the display(s) 514 between different battery life display modes, such as displaying a remaining battery life in either a percentage format, time format, or graphical representation of either of these formats. In other embodiments, the displays(s) 514 and the display interface 512 may be incorporated together into a graphical user interface ("GUI"). The GUI may include a touch screen display. When equipped with a touch screen display, the display may present a user with icons that are responsive to the touch of a user's finger or a pointing device such as a stylus. The icons presented to a user may be customized based on the particular application, but may include icons representing a battery life mode button that permits a user to switch between different battery life display modes, such as displaying a remaining battery life in either a percentage, time, or graphical format.

The periphery devices 510 may include one or more heating elements and air distribution devices. For example, in some configurations, one or more heating elements may be operatively coupled to the power circuit 508 and configured to convert electricity into heat. The heating elements may be electrical heating elements, and may include a metallic resistance heating element that can be operated in a constant or intermittent manner to elevate the temperature within an enclosed or temporarily enclosed spaced, such as the food storage compartment 30. In some configurations, the heating elements may be disposed within the food storage compartment 30, while in other configurations the heating elements may be remote from the food storage compartment 30. Heating elements rated at approximately 24.0 volts and approximately 400 watts may be used in connection with the warming cart 10, however other rated heating elements may also be used. The air distribution devices may include a blower motor that moves the air heated by the heating element around the enclosed or temporarily enclosed space, or directs the heated air to the enclosed or temporarily enclosed space through the use of tubing, channels, or other direction devices. In some configurations blower motors rated at approximately 24.0 volts and approximately 5.0 amps may be connected to the power circuit 508 and used to distribute the heat generated by the heating element to or within the enclosed or temporarily enclosed space. One or more cooling fans may also be operatively coupled with the power circuit 508. Cooling fans may be used to move air through the encasement that houses the battery life display circuit 500. Cooler air outside of the encasement may be drawn in by the cooling fans and used to cool the components comprising the battery life display circuit 500. In some battery life display circuits 500, cooling fans having a rating of approximately 12.0 volts DC, approximately 26 cubic feet per minute, and approximately 0.05 amps may be used. While periphery devices 510 comprising heating elements and air distribution devices are described herein, it is contemplated that other additional periphery devices 510 may be used in conjunction with the power circuit 508 and may terminate at the power circuit 508.

FIG. 6 is a flow diagram for displaying a battery life. At act 600, an exemplary method of displaying a battery life commences. At act 602 a processor, for example the processor of the power circuit 508, checks for the existence of an external power source. When the power converter 502 and the power circuit 508 are operatively coupled together (518), the processor can check to determine if there is a non-zero positive voltage at the output of the power converter 502. In such a case, the processor determines that the battery life display circuit 500 is connected to an alternating current power source 516. Alternatively, when the output of the power converter 502 is not operatively coupled to the power circuit 508, the processor could measure the voltage across the battery 506. When the voltage across the batteries 506 is greater than a predetermined threshold, for example approximately 26.80 volts, the processor determines that the battery life display circuit is connected to an alternating current power source 502, such as for example a power outlet. In response to detecting that the battery life display circuit is connected to a power outlet, the processor may cause a display to indicate that the circuit is connected to an external power source at act 604. In some configurations, this may involve a display circuit to illuminate the necessary elements of a light emitting diode display to illuminate so as to spell out the letters "AC". In other configurations, the display circuit may cause the elements of a liquid crystal display to illuminate to spell out the letters "AC". In yet other configurations, the display circuit may cause a GUI to display the letters "AC" or an icon or representative symbol identifying that the warming cart 10 is plugged into a power source.

If the processor determines at act 602 that the battery life display circuit 500 is not powered by an external power supply, the processor begins to evaluate, which, if any, periphery devices 510 are activated. At act 606, the processor evaluates whether all of the periphery devices 510 are powered on. In some configurations, this may be accomplished by monitoring the relays for each of the periphery devices 510. For example, if the processor determines that the relays for each heating element and blower motor connected to the power circuit 508 have been engaged, then the processor determines that the respective devices have been powered on. Alternatively, the processor may evaluate a periphery device 510 state condition flag, that can transition from an active to inactive and vice-versa state depending on the state of the periphery device, retained in a power circuit memory. In yet another situation, the processor may determine that all of the periphery device 510 are powered on based on the amount of power being delivered to the power circuit 508. When the processor determines that all of the periphery devices 510 are powered on, the processor sets the battery life scale to a first range at act 608. This first battery life scale may represent the range of the battery's measured voltage over a length of time from its maximum charge value (or maximum charge value attainable over time based on historical analysis) to a predetermined discharge value (e.g., approximately 65% or approximately 75% of remaining charge) when all of the periphery devices 510 are powered on. In some applications the first battery life scale may be between approximately 25.07 volts and approximately 23.90 volts.

If the condition at act 606 is not satisfied, the processor checks at act 610 whether at least one of the periphery devices 510 is activated and at least one periphery device 510 is not activated. The processor may perform this check by analyzing the relays or state condition flags for the periphery devices 510. When the condition at act 610 is satisfied, the processor sets, for example in a memory, at act 612 the battery life scale to a second range. The second battery life scale may be different than the first battery life scale set at act 608. The second battery life scale may represent the range of the battery's measured voltage over a length of time from its maximum charge value (or maximum charge value attainable over time based on historical analysis) to a predetermined discharge value (e.g., approximately 65% or approximately 75% of remaining charge) based on the configuration of periphery devices that are activated and those that are not activated. For example, if all heater elements are not activated and a blower motor is activated, then the second battery life scale may be between approximately 25.64 volts and approximately 24.40 volts.

If the condition at act 610 is not satisfied, the processor determines at act 614 if all of the periphery devices are not activated. The processor may perform this check by analyzing the relays or state flags for the periphery devices. When the condition at act 614 is satisfied, the processor sets, for example in a memory at act 616 the battery life scale to a third range. The third battery life scale may be different than the first battery life scale and the second battery life scale set at acts 608 and 612, respectively. The third battery life scale may represent the range of the battery's measure voltage over a length of time from its maximum charge value (or maximum charge value attainable over time based on historical analysis) to a predetermined discharge value (e.g., approximately 65% or approximately 75% of remaining charge) when none of the periphery devices that are activated. For example if all of the periphery devices 510 are powered off the third battery life scale may be between approximately 26.31 volts and approximately 24.71 volts.

In response to setting the battery life scale with either the first, second, or third scaling range, the processor may measure the voltage across the battery 506 at act 618. At act 620, the processor may apply the set battery life scale (e.g., first, second, or third) to the measured battery voltage and cause the display circuit to display the battery percentage on the display. In some configurations, the display may include a light emitting diode or other indicator or icon that can be illuminated or displayed on the display 514 by the display circuit 512 to convey to a user that the information displayed on the display is a percentage of battery life.

At act 622, the processor determines whether a battery mode life button (or representative GUI icon) has been depressed. When depressed, the processor may convert the battery life percentage into a time display and cause the display circuit to display the remaining time on the display. When a remain time period is displayed on the display, any percentage indictors illuminated on the display may be turned off, and a "time" indicator, such as a light emitting diode associated with a time indicator, or a GUI icon may be turned on. In some configurations, the remaining battery time may be a linear conversion performed by the processor with approximately 0% of battery life equal to zero hours and approximately 100% of battery life equal to the length of time to reach a predetermined discharge value (e.g., approximately 65% or approximately 75% of remaining charge). In some applications, this length of time may be approximately four hours. In other configurations, the conversion of the remaining battery percentage to remaining battery time may be non-linear. Each time that the battery mode life button (or representative GUI icon) is depressed by a user, the processor may switch the display mode between displaying a remaining percentage of battery life and a remaining time of battery life.

In other configurations, the processor could cause the display circuit to initially display the remaining battery life in a time format, and change to a percentage display upon activation of the battery life mode button. In yet other configurations, a battery life mode button may not be present, and the processor could cause the display circuit to change the format of the remaining battery life displayed after the expiration of a predefined time period.

The processor of the battery display life circuit 500 may be configured to periodically perform the flow diagram of FIG. 6. Alternatively, the processor of the battery display life circuit 500 may automatically perform the flow diagram of FIG. 6 when the processor determines that a periphery device 510 transitions from a powered on to a powered off state or vice versa.

FIG. 6A is a second flow diagram for displaying a battery life. At act 600A, the second flow diagram for displaying a batter life commences. At act 602A, a processor, for example the processor of the power circuit 508, checks for the existence of an external power source. The processor may perform this evaluation as described with respect to element 602 of FIG. 6. In response to detecting that the battery life display circuit is connected to a power outlet, the processor may cause a display to indicate that the circuit is connected to an external power source at act 604A. In some configurations, this may involve a display circuit to illuminate the necessary elements of a light emitting diode display to illuminate so as to spell out the letters "AC". In other configurations, the display circuit may cause the elements of a liquid crystal display to illuminate to spell out the letters "AC". In yet other configurations, the display circuit may cause a GUI to display the letters "AC" or an icon or representative symbol identifying that the warming cart 10 is plugged into a power source.

If the processor determines at act 602A that the battery life display circuit is not powered by an external power supply, the processor checks at act 624 whether a measurement timer has expired. The measurement timer may be customizable or fixed, but is provided to allow the battery to conserve power. In some configurations the measurement timer may be approximately 5 minutes. In other configurations, the measurement timer could be longer or shorter than approximately 5 minutes, and can be customized by an end-user of the warming cart. If the measurement timer has not expired, the processor will wait until the measurement timer has expired. If the measurement timer has expired, the processor evaluates, at act 606A whether all of the periphery device 510 are powered on. The processor may perform this evaluation as described with respect to element 606 of FIG. 6.

If all of the periphery devices 510 are not powered on, at act 626 the processor will activate all of the periphery devices 510 for a short period of time to allow the draw of power from battery 506 to stabilize. At act 618A, the processor measures the voltage across the battery 506 while all of the periphery devices are activated and after the draw of power from the battery 506 has stabilized. Once the battery voltage measurement is completed, the processor will return any previously inactive periphery devices 510 to an inactive state.

At act 620A, the processor may calculate a remaining battery life percentage. In order to determine the remaining battery life percentage, the processor may use a battery life scale as described with respect to element 608 of FIG. 6. Upon determining the remaining battery life percentage, the processor may cause the display circuit to display the battery percentage on the display. In some configurations, the display may include a light emitting diode or other indicator or icon that can be illuminated or displayed on the display 514 by the display circuit 512 to convey to a user that the information displayed on the display is a percentage of battery life.

At act 622A, the processor determines whether a battery mode life button (or representative GUI icon) has been depressed. When depressed, the processor may convert the battery life percentage into a time display and cause the display circuit to display the remaining time on the display. When a remaining time period is displayed on the display, any percentage indictors illuminated on the display may be turned off, and a "time" indicator, such as a light emitting diode associated with a time indicator, or a GUI icon may be turned on. In some configurations, the remaining battery time may be a linear conversion performed by the processor with approximately 0% of battery life equal to zero hours and approximately 100% of battery life equal to the length of time to reach a predetermined discharge value (e.g., approximately 65% or approximately 75% of remaining charge). In some applications, this length of time may be approximately four hours. In other configurations, the conversion of the remaining battery percentage to remaining battery time may be non-linear. Each time that the battery mode life button (or representative GUI icon) is depressed by a user, the processor may switch the display mode between displaying a remaining percentage of battery life and a remaining time of battery life.

In other configurations, the processor could cause the display circuit to initially display the remaining battery life in a time format, and change to a percentage display upon activation of the battery life mode button. In yet other configurations, a battery life mode button may not be present, and the processor could cause the display circuit to change the format of the remaining battery life displayed after the expiration of a predefined time period.

Although the battery life display circuit of FIG. 5 and flow diagrams of FIG. 6 and FIG. 6A are described herein with respect to specific supply and load voltage and current values, time periods, and estimated percentages of remaining battery life, it is to be understood that these values are exemplary, and are not intended in any way to limit the scope of the claims. In addition, while the charge controller 504 is described as a separate component, it is contemplated that the functionality of the charge controller 504 could be integrated into other elements, for example the power converter 502 or the power circuit 508. Moreover, while FIG. 6 describes three battery scales, it is contemplated that additional battery scales could be configured depending upon the number of periphery devices connected to the power circuit and the particular application where some of the periphery devices are activated while other periphery devices are not activated.

Figure 8:
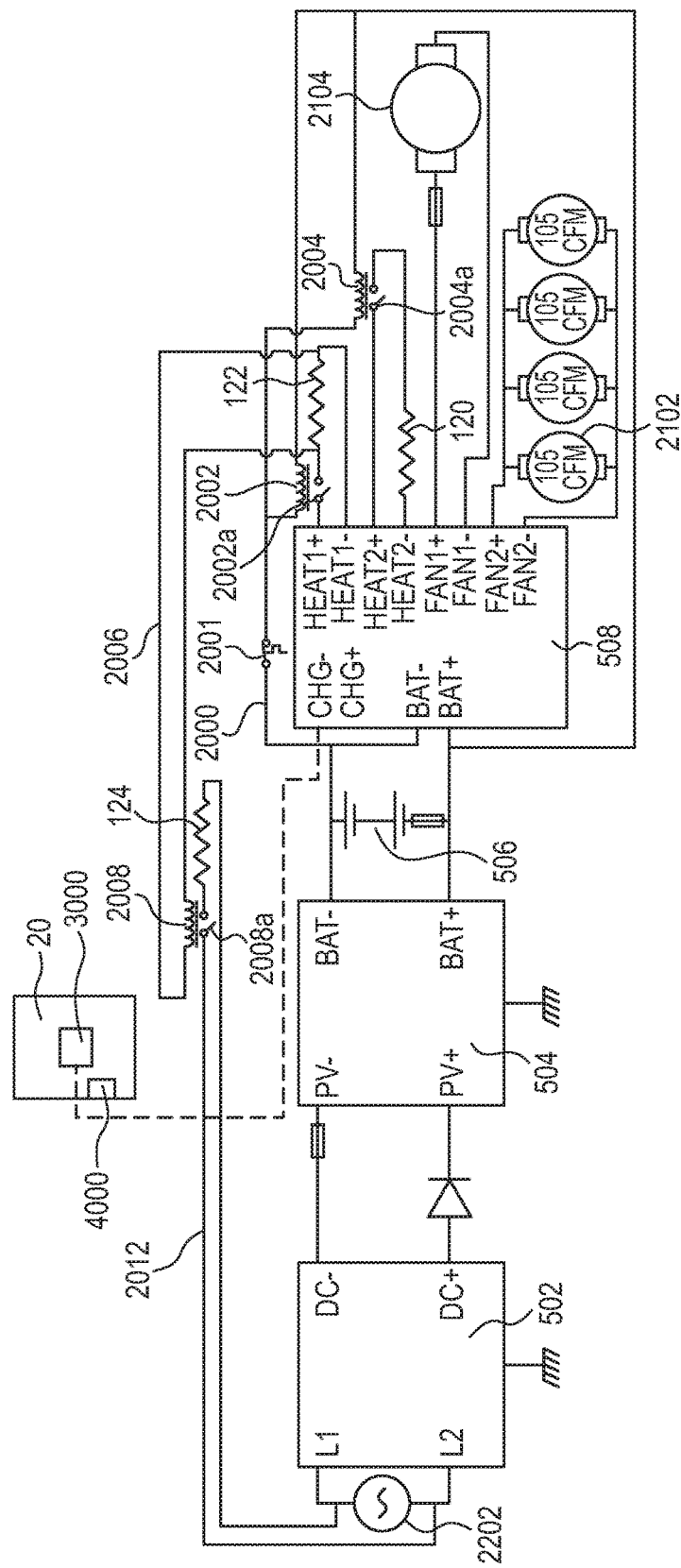
FIG. 8 is an electrical schematic of an embodiment of a heating system for a portable warming cart.

Turning now to FIG. 8, a system for heating a warming cart is provided. The system 1000 includes a plurality of heaters 120, 122, 124 that are provided to heat the food storage compartment 30 of the warming cabinet, and in some embodiments may be electric heaters, such as resistance heaters. In some embodiments, one or more of the heaters (120, 122) may be DC resistance heaters with the remaining heaters being AC resistance heaters 124. The system is best understood with reference to the schematic circuit diagram depicted in FIG. 8. The DC heaters 120, 122 are powered from a battery 506, which is discussed above. The battery 506 provides current to the DC heaters 120, 122 via a power board 508. The power board 508 may be a PLC, or a solid state controller, or other components that and selectively send or withhold DC power from loads connected thereto. The power board 508 may also control a plurality of fans 2104, 2102 discussed below.

In some embodiments, the power board 508 receives an input from one or more temperature sensors (3000, shown schematically in FIG. 8) that are disposed within or in communication with the housing 20 and in some embodiments a food storage compartment within the housing, with the power board 508 selectively operating the DC heaters with feedback control to maintain the temperature within the food storage compartment within a desired band. In some embodiments, the power board 508 may operate one or both of the DC heaters 122, 120 when the sensed temperature is below a high set point and turn off one or both of the heaters when the sensed temperature is above (and in some embodiments at) the temperature setpoint. In other embodiments the power board 508 may operate one or both of the DC heaters 122, 120 when the sensed temperature is within or below a predetermined temperature band, and not operate the heaters when the sensed temperature is above the band.

In embodiments where multiple sensors are provided, the power board 508 may take an average of the sensors 3000, a weighted average of the sensors 3000, control based upon a specified sensor 3000, or control based upon the sensor 3000 that first reaches the high or low end of the range, or in other control schemes. In some embodiments, the controller 4000 (shown schematically in FIG. 8) (other than the power board) may determine the proper operation of the heaters and send a signal to the power board 508 to instruct the heaters to be turned on and off as appropriate.

In some embodiments, the power board may receive DC current from the battery 506, which is maintained in a charged condition by a charge controller 504. The charge controller 504 may receive DC current via a power supply 502, which converts AC power from a source 2202 (such as a plug into a conventional electrical outlet).

The first DC heater 120 may be connected to input and output terminals of the power board 508, and may be in-line with a contact 2004a that is operated by a first relay 2004. Similarly, the second DC heater 122 may be connected to input and output terminals of the power board, and may be in-line with a contact 2002a that is operated by a second relay 2002. The circuit may include a line 2000 that runs between the positive and negative terminals of the battery 506. In some embodiments, the line 2000 may include a single line that is connected to one terminal of the battery and two parallel lines that return to the negative terminal of the battery 506. The line 2000 may include a limit switch, and in some embodiments, a high temperature limit switch 2001 that opens when the measured temperature of the food storage compartment, or of the heaters or of another component within the warming cart exceeds the rating of the high limit switch. In some embodiments, the high limit switch 2001 may be calibrated to open at 275 degrees F., above which damage may occur to the components of the warming cart. If the high limit switch 2001 opens the no current flows through the line 2000.

The line 2000 additionally provides current to the first and second relays 2004, 2002, which may be wired in parallel or in series within the line. When the high limit switch is closed, current runs through the first and second relays 2004, 2002, therefore closing the related contacts 2004a, 2002a, and therefore allowing current to flow from the power board to the first and second heaters as directed by the power board (either directly, or via the controller).

A line 2006 may be provided that taps across one of the DC heaters, such as the second DC heater 122. The line extends includes a third relay 2008 that operates a contact 2008a. Accordingly, when the second DC heater 122 is energized by the power board, the third relay 2008 and closes the associated contact 2008a.

The AC heater 124 is wired to the AC source 2202 via a line 2012. The contact 2008 of the third relay is wired in-line with the AC heater 124, such that current can flow through the AC heater when the second DC heater 122 is energized by the power board 508. In instances where the warming cart is not connected to a source of AC power (and therefore running off of the battery) the AC heater 124 does not operate because no current flows through the line 2012. When the AC source of power 2202 is reconnected to the warming cart, the AC heater 124 therefore energizes any time that the second DC heater 122 is called for. This set up allows for three heaters to simultaneously operate when the warming court is connected to a source of AC power, and when the temperature sensor(s) identify that the monitored temperature is below the normal band, which allows the warming cart to relatively rapidly heat up. Similarly, this design allows for warming carts with larger volumes to heat up in a desired rate when connected to a source of AC power, while reducing the amount of heaters that operate to maintain the food storage compartment 30 within the desired band when the warming cart is disconnected from a source of AC power, with the heaters being operated by the battery. In some embodiments, the power board 508 may also provide (selective or continuous) DC current to fans as well as other components within the warming cart. For example, a blower 2104 may be provided that provides for internal air movement within the food storage compartment 30 and across the heaters. One or more blowers 2102 may also be provided that provide cooling air flow to various portions of the cabinet, such as the electrical distribution system, the batteries, the outer walls of the cabinet, and the like.

Representative embodiments of the disclosure are embodied by the numbered paragraphs presented herebelow:

Numbered Paragraph 1. A method of displaying a battery life for a warming cart battery, comprising:
  determining with a processor an operation state of each of a plurality of periphery warming cart devices;
  automatically setting a battery scale of a warming cart battery selected from a plurality of battery scales based on which of the plurality of periphery warming cart devices are in an active operation state, wherein each of the plurality of battery scales represent a different range of voltages between a charge value for the warming cart battery and a predetermined state of discharge of the warming cart battery over a period of time based on the active operation state of the plurality of periphery warming cart devices;
  measuring a warming cart battery voltage; and
  automatically displaying a remaining life of the warming cart battery based on the measured warming cart battery voltage in relation to the set battery scale.

Numbered Paragraph 2: The method of numbered paragraph 1, where the plurality of periphery warming cart devices comprise a blower motor.

Numbered Paragraph 3: The method of numbered paragraph 1, where the plurality of periphery warming cart devices comprise a heating element.

Numbered Paragraph 4: The method of numbered paragraph 1, where the act of automatically setting a battery scale of a warming cart battery comprises setting the battery scale to range between approximately 23.97 volts and approximately 25.07 volts when it is determined that the plurality of periphery warming cart devices in the active operation state comprise a heating element and blower motor.

Numbered Paragraph 5: The method of numbered paragraph 1, where the display of the remaining battery life is in a percentage form.

Numbered Paragraph 6: The method of numbered paragraph 5, further comprising converting the battery life percentage to a remaining time of battery life with the processor and displaying the remaining time of battery life on a display.

Numbered Paragraph 7: The method of numbered paragraph 1, where the act of automatically setting a battery scale of a warming cart battery comprises setting the battery scale to range between approximately 24.40 volts and approximately 25.64 volts when it is determined that the plurality of periphery warming cart devices in the active operation state comprise a heating element.

Numbered Paragraph 8: The method of numbered paragraph 7, where the display of the remaining battery life is in a percentage form.

Numbered Paragraph 9: The method of numbered paragraph 8, further comprising converting the battery life percentage to a remaining time of battery life with the processor and displaying the remaining time of battery life on a display.

Numbered Paragraph 10: The method of numbered paragraph 1, where the act of automatically setting a battery scale of a warming cart battery comprises setting the battery scale to range between approximately 24.71 volts and approximately 26.31 volts when it is determined that the plurality of periphery warming cart devices in the active operation do not comprise a heating element and blower motor.

Numbered Paragraph 11: The method of numbered paragraph 10, where the display of the remaining battery life is in percentage form.

Numbered Paragraph 12: The method of numbered paragraph 11, further comprising converting the battery life percentage to a remaining time of battery life with the processor and displaying the remaining time of battery life on a display.

Numbered Paragraph 13: A battery life display circuit, comprising:
- a warming cart battery;
- a plurality of periphery warming cart devices configured to draw power from the warming cart battery;
- a processor configured to automatically set a battery scale used to measure a remaining life of the warming cart battery based on an operational status of each of the plurality of periphery warming cart devices; and
- a display operatively coupled to the processor for displaying a remaining life of the warming cart battery as a percentage of a voltage across the warming cart battery as measured by the processor and the automatically set batter scale.

Numbered Paragraph 14: The battery life display circuit of numbered paragraph 13, where the processor may convert the remaining life of the warming cart battery to a remaining period of time.

Numbered Paragraph 15: The battery life display circuit of numbered paragraph 14, where the display is further configured to display the remaining period of time in response to a receiving a changed display mode signal received through a button operatively connected to the display.

Numbered Paragraph 16: A food holding cabinet, comprising:
- a housing with a food storage compartment and a battery compartment
- the battery compartment configured to receive a battery and an electrical connection configured to allow for the flow of electrical current from the battery to a plurality of electrical heaters disposed in thermal communication with the food storage compartment,
- wherein the battery compartment comprises a shelf that is slidably mounted within the battery compartment, the shelf being slidable between a stowed position where the battery is disposed within the housing, and an extended position wherein at least a portion of the battery extends outside of the housing.

Numbered Paragraph 17: The food holding cabinet of numbered paragraph 16, further comprising a roof that is fixed with respect to the shelf such that the roof slides along with the shelf, wherein the battery is slidably disposed between the roof and the shelf, and wherein the roof may be urged toward the battery to tightly engage a surface of the battery.

Numbered Paragraph 18: The food holding cabinet of numbered paragraph 17, further comprising a lock disposed between the roof and the shelf, wherein the lock may be manipulated to urge the roof toward the battery to establish the tight engagement with the surface of the battery, and the lock may be released to remove the tight engagement.

Numbered Paragraph 19: The food holding cabinet of numbered paragraph 18, wherein the roof is cantilevered from a riser that extends from the shelf, wherein the lock engages the roof at a cantilevered portion of the roof.

Numbered Paragraph 20: The food holding cabinet of numbered paragraph 18, wherein the lock is an over center mechanism with an operator, wherein the lock is urged to a lock position to urge the roof toward the battery when the operator is positioned on a first side of an intermediate position, and where the lock is urged toward a release position to remove the tight engagement between the roof and the battery when the operator is positioned on a second side of an intermediate position opposite the first side.

Numbered Paragraph 21: A system for heating a transportable cabinet, comprising
- a battery electrically connected to provide DC electrical current to a DC power board;
- a first electrical heater configured to when energized provide heat input to a housing within the transportable cabinet, the first heater electrically connected to the DC power board, the DC power board selectively supplying electrical current to the first heater through a first electrical line;
- a second electrical line extending between positive and negative terminals of the battery, the second electrical line including a high temperature limit switch that opens when a detected temperature within the housing reaches a selected temperature, the second electrical line includes a first relay, and a first contact associated with the first relay is disposed in the first electrical line;
- an AC connector configured for connection to a source of AC electrical current, the AC connector electrically connected to a third electrical line that is electrically connected to a second electrical heater configured to when energized provide heat input to the housing within the transportable cabinet;
- a fourth electrical line with opposite ends that connect to the first electrical line on opposite electrical ends of the first heater, wherein the fourth electrical line includes a second relay, and a second contact associated with the second relay is disposed in the third electrical line,
- wherein the first relay is configured such that when current flows therethrough, the first contact is shut and when current does not flow therethrough the first relay, the first contact is open, and the second relay is configured such that the current flows therethrough, the second contact is shut, and when electrical current does not flow through the second relay, the second contact is open.

Numbered Paragraph 22. The system of numbered paragraph 21, further comprising a third electrical heater configured to when energized provides heat input to the housing, the third heater electrically connected to the DC power board, the DC power board selectively supplying electrical current to the third heater through a fifth electrical line.

Numbered Paragraph 23. The system of numbered paragraph 22, further comprising a fan electrically connected to the DC power board, the DC power board continuously or selectively supplying electrical current to the fan.

Numbered Paragraph 24. The system of numbered paragraph 21, wherein the battery receives current from the AC connector, and an AC to DC converter is electrically connected to the battery and to the AC connector, wherein when AC electrical current is provided to the AC connector, the battery receives DC current from the AC to DC converter to charge the battery.

Numbered Paragraph 25. The system of numbered paragraph 21, wherein the second relay operates when the source of AC electrical current is connected to the AC connector, and wherein the second relay operates when the source of AC electrical current is not connected to the AC connector, which therefore results in no current flowing through the third electrical line.

Numbered Paragraph 26. The system of numbered paragraph 25, further comprising a temperature sensor disposed within the housing, wherein the DC power board supplies electrical current to the first electrical line when a temperature sensed by the temperature sensor is below a setpoint, and does not supply electrical current to the first electrical line when the sensed temperature is above the setpoint.

Numbered Paragraph 27. The system of numbered paragraph 25, further comprising a temperature sensor disposed within the housing, wherein the DC power board supplies electrical current to the first electrical line when a temperature sensed by the temperature sensor is within or below a predetermined range, and does not supply electrical current to the first electrical line when the sensed temperature is above the predetermined range.

While various embodiments of the invention have been described, it will be apparent to those of ordinary skill in the art that many more embodiments and implementations are possible within the scope of the invention. Accordingly, the invention is not to be restricted except in light of the attached claims and their equivalents.

The invention claimed is:

1. A system for heating a transportable cabinet, comprising a battery electrically connected to provide DC electrical current to a DC power board; a first electrical heater configured to when energized provide heat input to a housing within the transportable cabinet, the first electrical heater electrically connected to the DC power board, the DC power board selectively supplying electrical current to the first heater through a first electrical line; a second electrical line extending between positive and negative terminals of the battery, the second electrical line including a high temperature limit switch that opens when a detected temperature within the housing reaches a selected temperature, the second electrical line includes a first relay, and a first contact associated with the first relay is disposed in the first electrical line; an AC connector configured for connection to a source of AC electrical current, the AC connector electrically connected to a third electrical line that is electrically connected to a second electrical heater configured to when energized provide heat input to the housing within the transportable cabinet; a fourth electrical line with opposite ends that connect to the first electrical line on opposite electrical ends of the first electrical heater, wherein the fourth electrical line includes a second relay, and a second contact associated with the second relay is disposed in the third electrical line, wherein the first relay is configured such that when current flows therethrough, the first contact is shut and when current does not flow therethrough the first relay, the first contact is open, and the second relay is configured such that when the current flows therethrough, the second contact is shut, and when electrical current does not flow through the second relay, the second contact is open.

2. The system of claim 1, further comprising a third electrical heater configured to when energized provides heat input to the housing, the third electrical heater electrically connected to the DC power board, the DC power board selectively supplying electrical current to the third electrical heater through a fifth electrical line.

3. The system of claim 2, further comprising a fan electrically connected to the DC power board, the DC power board continuously or selectively supplying electrical current to the fan.

4. The system of claim 3, wherein the battery receives current from the AC connector, and an AC to DC converter is electrically connected to the battery and to the AC connector, wherein when AC electrical current is provided to the AC connector, the battery receives DC current from the AC to DC converter to charge the battery.

5. The system of claim 3, wherein the second relay operates when the source of AC electrical current is connected to the AC connector, and wherein the second relay operates when the source of AC electrical current is not connected to the AC connector, which therefore results in no current flowing through the third electrical line.

6. The system of claim 5, further comprising a temperature sensor disposed within the housing, wherein the DC power board supplies electrical current to the first electrical line when a temperature sensed by the temperature sensor is below a setpoint, and does not supply electrical current to the first electrical line when the sensed temperature is above the setpoint.

7. The system of claim 5, further comprising a temperature sensor disposed within the housing, wherein the DC power board supplies electrical current to the first electrical line when a temperature sensed by the temperature sensor is within or below a predetermined range, and does not supply electrical current to the first electrical line when the sensed temperature is above the predetermined range.

* * * * *

UNITED STATES PATENT AND TRADEMARK OFFICE
CERTIFICATE OF CORRECTION

PATENT NO. : 10,408,885 B2
APPLICATION NO. : 15/594997
DATED : September 10, 2019
INVENTOR(S) : Bohn et al.

It is certified that error appears in the above-identified patent and that said Letters Patent is hereby corrected as shown below:

In the Claims

In Column 18, Claim 2, Line 11 should read as follows:
--electrical heater configured to when energized provide heat--

Signed and Sealed this
Fifth Day of September, 2023

Katherine Kelly Vidal
*Director of the United States Patent and Trademark Office*